United States Patent
Compaan et al.

(10) Patent No.: US 7,141,863 B1
(45) Date of Patent: *Nov. 28, 2006

(54) METHOD OF MAKING DIODE STRUCTURES

(75) Inventors: Alvin D. Compaan, Sylvania, OH (US); Akhlesh Gupta, Sylvania, OH (US)

(73) Assignee: University of Toledo, Toledo, OH (US)

( * ) Notice: Subject to any disclaimer, the term of this patent is extended or adjusted under 35 U.S.C. 154(b) by 42 days.

This patent is subject to a terminal disclaimer.

(21) Appl. No.: 10/722,643

(22) Filed: Nov. 26, 2003

Related U.S. Application Data

(60) Provisional application No. 60/429,715, filed on Nov. 27, 2002.

(51) Int. Cl.
*H01L 29/00* (2006.01)
(52) U.S. Cl. .................. 257/530; 275/528
(58) Field of Classification Search ........... 438/85, 438/86, 104; 257/528, 530
See application file for complete search history.

(56) References Cited

U.S. PATENT DOCUMENTS

| | | | |
|---|---|---|---|
| 4,611,091 A | 9/1986 | Choudary et al. | |
| 4,612,411 A | 9/1986 | Wieting et al. | |
| 4,798,660 A | 1/1989 | Ermer et al. | |
| 4,915,745 A | 4/1990 | Pollock et al. | |
| 5,078,804 A | 1/1992 | Chen et al. | |
| 5,393,675 A | 2/1995 | Compaan | |
| 5,436,204 A | 7/1995 | Albin et al. | |
| 5,474,939 A | 12/1995 | Pollock et al. | |
| 5,714,010 A * | 2/1998 | Matsuyama et al. | 118/723 MW |
| 5,909,632 A | 6/1999 | Gessert | |
| 6,040,521 A | 3/2000 | Kushiya et al. | |
| 6,852,614 B1 * | 2/2005 | Compaan et al. | 438/603 |
| 2003/0180983 A1 * | 9/2003 | Oswald et al. | 438/57 |

OTHER PUBLICATIONS

A.N. Tiwari, A. Romeo, D. Baetzner and H. Zogg; Progress in Photovoltaics: Research and Applications; Prog. Photovolt: Res. Appl. 2001; 9:211-215; entitled: "Flexible CdTe Solar Cells on Polymer Films".

G. Gordillo, M. Grizalez, L.C. Moreno and F. Landazabal; Phys. Stat. Sol. (b) 220, 215 (2000) entitled: "Influence of the Optical Window on the Performance of TCO/CdS/CdTe Solar Cells".

L. C. Moreno et al.; Phys. Stat. Sol. (b) 220, 289 (2000); entitled: "pH Effect on the Deposition of CdS on ZnO and SnO2:F Substrates by CBD Method".

Alvin D. Compaan et al.; Annual Technical Report for the Period Mar., 1998 to Mar., 1999; Contract No. ZAF-8-17619-14; Dept. of Physics and Astronomy,The University of Toledo; entitled: "High Efficiency Thin Film CdTe and a-Si Based Solar Cells".

(Continued)

*Primary Examiner*—Long Pham
(74) *Attorney, Agent, or Firm*—MacMillan, Sobanski & Todd, LLC

(57) ABSTRACT

A method of making a diode structure includes the step of depositing a transparent electrode layer of any one or more of the group ZnO, ZnS and CdO onto a substrate layer, and depositing an active semiconductor junction having an n-type layer and a p-type layer onto the transparent electrode layer under process conditions that avoid substantial degradation of the electrode layer. A back electrode coating layer is applied to form a diode structure.

38 Claims, 3 Drawing Sheets

OTHER PUBLICATIONS

A. Romeo et al.; 2nd World Conference and Exhibition on Photovoltaic Solar Energy Conversion, Jul., 1998; entitled: "Influence of Transparent Conducting Oxides on the Properties of CdTe/CdS".

J. Han et al.; 1993 American Institute of Physics; pp. 840-842; Appl. Phys. Letter. 62 (8); Feb. 22, 1993; entitled: "Heavy p-doping of ZaTe by Molecular Beam Epitaxy using a Nitrogen Plasma Source".

* cited by examiner

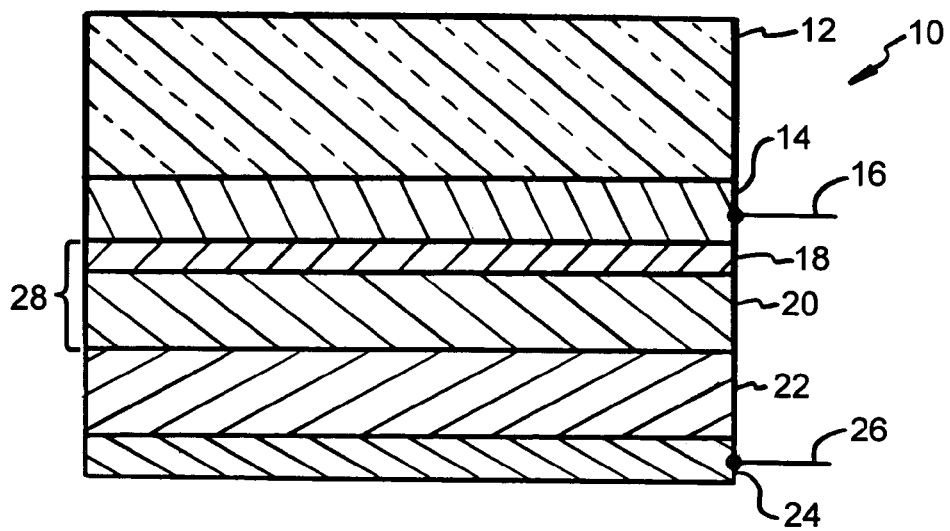
FIG. 1
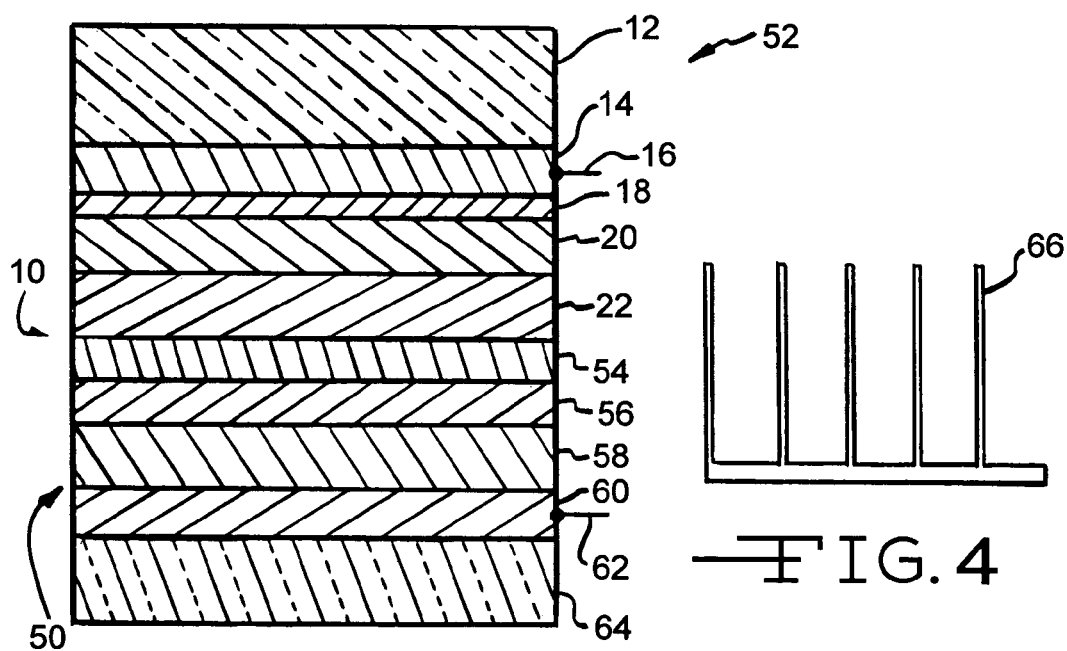
FIG. 3
FIG. 4

METHOD OF MAKING DIODE STRUCTURES

CROSS-REFERENCE TO RELATED APPLICATIONS

This application claims priority from U.S. Provisional Patent Application Ser. No. 60/429,715, filed Nov. 27, 2002, and entitled METHOD OF MAKING DIODE STRUCTURES.

GOVERNMENT INTERESTS

The United States Government has certain rights in this invention pursuant to Contract Nos. NREL # AAT-1-30620-09 and NREL # NDJ-1-30630-02 awarded by the U.S. Department of Energy.

TECHNICAL FIELD

The present invention concerns diode structures and methods of manufacturing diode structures, such as, for example, photovoltaic cells. More particularly, this invention relates to methods of manufacturing diode structures by depositing layers of semiconductor materials onto a substrate layer.

BACKGROUND OF THE INVENTION

It is well known that solar cells or photovoltaic cells can be used to convert solar energy into electric current. Typical photovoltaic cells include a substrate layer for mounting the cell and two ohmic contacts or electrode layers for passing current to an external electrical circuit. The cell also includes an active semiconductor junction, usually comprised of two or three semiconductor layers in series. The two layer type of semiconductor cell consists of an n-type layer and a p-type layer, and the three layer type includes an intrinsic (i-type) layer positioned between the n-type layer and the p-type layer for absorption of light radiation. The photovoltaic cells operate by having readily excitable electrons that can be energized by solar energy to higher energy levels, thereby creating positively charged holes and negatively charged electrons at the interface of various semiconductor layers. The creation of these positive and negative charge carriers applies a net voltage across the two electrode layers in the photovoltaic cell, establishing a current of electricity.

Solar cells or photovoltaic cells are examples of diode structures where the light passes through a transparent electrode layer and energizes an active semiconductor junction. The diode structure can also take on a different mode, where the current is applied to the transparent electrode layers of a layered semiconductor cell, and the output is light energy. In such a case the diode structure is a light emitting diode (LED). In a specific example of this type of diode structure, the light emitting diode is incorporated into a flat panel display. Another area where the diode structure of the invention can be used is in energy efficient coatings for glass.

The semiconductor layers of diode structures may be formed from single crystalline materials, amorphous materials, or polycrystalline materials. Single crystalline layers are often made with a molecular beam epitaxy (NBE) process (or other vapor deposition process), but the largest area of a substrate that can be practically covered using such processes is on the order of several tens of square centimeters because it is limited by the size of single crystal substrates, which is an impractical size when considering the surface area required for economically practical solar cells. Therefore, although single crystal photovoltaic materials can be used to generate conversion efficiencies over 20 percent, they have significant drawbacks because of their high manufactured cost. Accordingly, where the solar cell must compete with conventional electricity generation by nuclear or fossil fuel, polycrystalline materials are viewed as the material of choice for the production of semiconductors and solar cells using such semiconductors. Typically, the polycrystalline material of choice for a semiconductor in a photovoltaic cell is a group II-group VI compound, such as cadmium telluride. Cadmium telluride is preferred for thin film photovoltaic applications because of its direct band gap of 1.5 electron volts which is well matched to the solar spectrum, and its ability to be doped n-type and p-type, which permits formation of a variety of junction structures. P-type cadmium telluride is also compatible with n-type semiconductor partners, such as cadmium sulfide, to form heterojunction solar cells.

It is known that an RF sputtering technique can be used to deposit thin films of cadmium telluride onto substrates for use in photovoltaic cells, as disclosed in U.S. Pat. No. 5,393,675 to Compaan. The RF sputtering technique can also be used for depositing other thin group II-group VI semiconductor films such as cadmium sulfide and zinc telluride for use in a photovoltaic cell. RF sputtering involves positioning a substrate in a pressure chamber and operating a planar magnetron sputtering gun. The gun includes a target (the cathode) of pressed and sintered cadmium sulfide or cadmium telluride typically prepared from powder. The substrate is positioned behind the target and is coated as the target is bombarded. The process takes place typically in an inert atmosphere of argon gas.

In most photovoltaic cells it is necessary to dope one or more semiconductor layers to be highly conductive to achieve easy flow of electrons and holes into the respective contact electrodes. Particularly for cadmium telluride and zinc telluride and related semiconductors, copper is often used for this dopant. While the doping with copper is successful in obtaining the desired conductivity, the use of copper has its limitations. It has been found that over time the copper diffuses into other semiconductor layers of the photovoltaic cell, thereby causing a loss in efficiency. When copper is used to dope a zinc telluride contacting layer the copper tends to move into the cadmium telluride layer and even penetrate into the cadmium sulfide/cadmium telluride junction where it degrades the photovoltaic activity. Further, when zinc telluride and other semiconductors are heavily doped with copper, the semiconductor layer begins to lose its transparency to radiation transmission.

One of the requirements for the transparent electrode layers that pass current to the external electrical circuit in diode structures is that the electrode layers or conductors must 1.) conduct electricity to and from the diode structure, and 2.) be substantially transparent to certain light wavelengths (typically over 400 nm) so that the solar energy can reach the primary semiconductor layers forming the active semiconductor junction. In many cases the restriction on the amount of light allowed to be passed through the conductor layer sets a practical limit on the efficiency of the photovoltaic cell. Also, the electrical conductivity of the electrode layer is an important factor in the overall efficiency of a photovoltaic cell. Diminished conductivity of the transparent electrode layers reduces the efficiency of the solar cell. It would be advantageous if there could be developed improved diode structures, such as solar cells or photovoltaic cells, and such as LED's, particularly where the improved diode structures exhibit increased efficiency due to improvements in either the transparency of the transparent electrode layers, or the conductivity of the transparent electrode layers, or both.

SUMMARY OF THE INVENTION

The above objects as well as other objects not specifically enumerated are achieved by a method of making a diode structure including the step of depositing a transparent electrode layer of any one or more of the group ZnO, ZnS and CdO onto a substrate layer, and depositing an active semiconductor junction having an n-type layer and a p-type layer onto the transparent electrode layer under process conditions that avoid substantial degradation of the electrode layer. A back electrode coating layer is applied to form a diode structure.

According to this invention there is also provided a method of making a diode structure including the step of depositing a transparent electrode layer of any one or more of the group ZnO, ZnS and CdO onto a flexible layer. An active semiconductor junction having an n-type layer and a p-type layer is deposited onto the substrate layer under process conditions that avoid substantial degradation of the electrode layer. A back coating electrode layer is applied to form a diode structure.

According to this invention there is also provided a method of making a diode structure including the step of depositing a transparent electrode layer of any one or more of the group ZnO, ZnS and CdO onto a substrate layer, and scribing the transparent electrode layer into sections. An active semiconductor junction having an n-type layer and a p-type layer is deposited onto the transparent electrode layer under process conditions that avoid substantial degradation of the electrode layer. The active semiconductor junction is scribed into sections. A back electrode coating layer is applied to form a diode structure. The back electrode coating layer is scribed into sections. A series of cells is formed, with each of the cells comprising one of the electrode layer sections, one of the active semiconductor junction sections, and one of the back electrode coating layer sections. The series of cells is electrically connected in series to form a monolithically integrated solar panel.

According to this invention there is also provided a method of making a diode structure having a substrate configuration including the step of applying a back electrode coating layer to a polymer substrate. An active semiconductor junction having a p-type layer and an n-type layer is deposited onto the transparent back layer under process conditions that avoid substantial degradation of the polymer substrate. A transparent electrode layer of any one or more of the group ZnO, ZnS and CdO is deposited onto the semiconductor junction to form a diode structure.

Various objects and advantages of this invention will become apparent to those skilled in the art from the following detailed description of the preferred embodiment, when read in light of the accompanying drawings.

BRIEF DESCRIPTION OF THE DRAWINGS

FIG. 1 is a schematic elevational view of a photovoltaic cell made according to the present invention.

FIG. 3 is a schematic elevational view of a photovoltaic cell made according to the present invention, with the photovoltaic cell being assembled with a second photovoltaic cell for absorbing infrared solar radiation.

FIG. 4 is a schematic plan view of the conductive grid that forms the lowermost layer of the first photovoltaic cell, below a back conductive electrode or layer, and uppermost layer of the second photovoltaic cell, above a transparent conductor layer, of FIG. 3 in a 3 or 4-terminal tandem combination of photovoltaic cells.

DETAILED DESCRIPTION OF THE INVENTION

Figure 2:
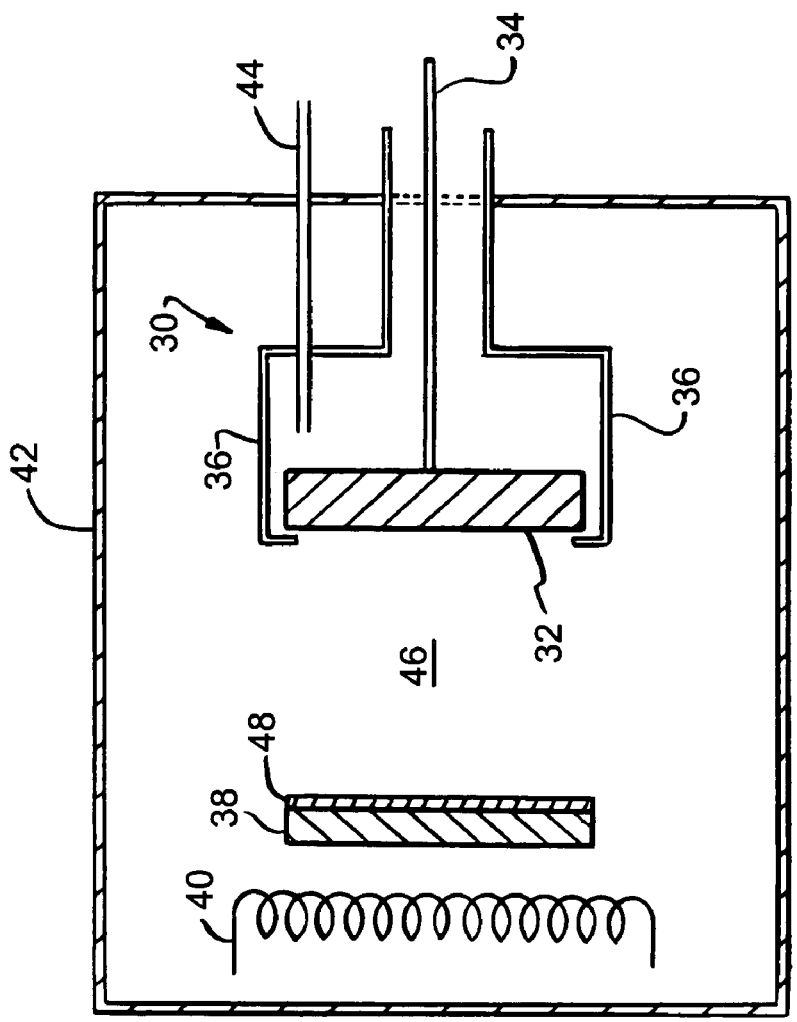
FIG. 2 is a schematic plan view of a sputtering apparatus that can be used with the method of the present invention.

The method of the invention can be used to make a thin-film photovoltaic cell, one of which is indicated generally at 10 in FIG. 1. The photovoltaic cell 10 includes a substrate layer 12, which preferably is a glass substrate 12. Other transparent materials, such as polyimides, can be used for the glass substrate 12. A layer of a transparent conductive material, such as a transparent electrode layer 14, is applied to the glass layer 12. The transparent electrode layer 14 forms one of the two ohmic contacts or electrodes for the photovoltaic cell 10, and contains a conductive lead 16 for conducting current through an electric circuit, not shown. The transparent electrode layer is also sometimes referred to as a transparent conductive oxide, although some useful materials for this purpose are not oxides.

In the embodiment of the invention shown in FIG. 1, the device is shown in the superstrate configuration, which means that the substrate material used during the deposition becomes the top (superstrate) window, and the various layers are deposited in order starting with the substrate layer 12. In other configurations the substrate material used during the deposition becomes the bottom layer, and the various layers are deposited in order starting with this substrate material. Therefore, for purposes of this invention, the term "substrate layer" means either a substrate or a superstrate.

In a preferred embodiment of the invention, the transparent electrode layer 14 is any one or more of the group zinc oxide (ZnO), zinc sulfide (ZnS) and cadmium oxide (CdO). Most preferably, the transparent electrode layer 14 is ZnO. Also, preferably, the transparent electrode layer 14, whether ZnO, ZnS or CdO, and is doped with a Group III element to form an n-type semiconducting layer. Most preferably, the transparent electrode layer 14 is ZnO doped with aluminum.

The first of two primary semiconductor layers, together forming an active semiconductor junction 28, is an n-type semiconductor layer 18. In a preferred embodiment of the invention this n-type semiconductor layer is cadmium sulfide (CdS). The second primary semiconductor layer is a p-type semiconductor 20, which is preferably cadmium telluride (CdTe). Numerous other semiconductor layers can be used for either of these two primary semiconductor layers, as will be appreciated by those skilled in the art. It is to be understood that an intrinsic semiconductor layer, not shown, can be disposed between the n-type semiconductor layer and the p-type semiconductor layer in conjunction with the present invention.

A layer of back contact material is indicated at 22. Typically, this layer may be CdTe heavily doped with copper or a layer of tellurium formed by chemical etching of the CdTe. The back contact layer 22 acts to provide an interface between the p-type semiconductor layer 20 and a back conductive electrode or layer 24, which is the second of the two ohmic contacts or electrodes for the photovoltaic cell 10. The conductive back electrode layer 24 contains a conductive lead 26 for conducting current through the electric circuit, not shown. Typically, the conductive electrode layer is made of nickel, titanium, chromium, aluminum, gold or some other conductive material. Optionally, an additional protective or buffer layer of zinc telluride, not shown, can be positioned between the back contact layer 22 and the cadmium telluride semiconductor layer 20 to facilitate hole (positive charge carrier) transport from the cadmium telluride layer to the back electrode layer and to protect the cadmium telluride layer from foreign contamination by migration. Also, it is to be understood that the layer 22 of back contact material and the back electrode layer 24 can sometimes be combined into a single layer, not shown. To handle both functions in a single contacting layer, the single layer would have to have an electrical conductivity substantially equivalent to that of the back electrode layer 24, and yet still would have to be capable of making good transition to the CdTe semiconductor layer.

During operation of the photovoltaic cell 10, light in the visible spectrum incident on the glass substrate 12 travels through the transparent electrode layer 14 and as far as the cadmium telluride layer 20, where the light is largely absorbed. The absorbed light together with the field created at the cadmium sulfide/cadmium telluride junction causes a current to flow through the circuit and a voltage appears across the two conductive layers 14 and 24. High transparency in the transparent electrode layer 14 is needed to maximize the number of photons absorbed in the layers below, i.e., the n-type layer 18 and the p-type layer 20. When the electrode layer 14 is indicated as being "transparent", the electrode layer is able to transmit, and not absorb, that portion of the incident light that is to be absorbed by the active semiconductor junction. The portion of the solar light spectrum that is of most importance for transition though the transparent electrode layer 14 is light having wavelengths greater than about 400 nm.

One of the key features of the method of the present invention is that the deposition of the n-type and p-type layers of the active semiconductor junction is carried out under conditions that do not substantially degrade the properties of the transparent electrode layer 14. Under many semiconductor layer depositing techniques, the n-type layer 18 and the p-type layer 20 would be deposited using evaporation (including close spaced sublimation, CSS), molecular beam epitaxy (MBE), vapor transport deposition, or chemical vapor deposition (CVD). These techniques usually are undertaken with the substrate heated to a temperature well above 400 degrees C. to enable the break up of the incident molecules as well as to provide energy for surface diffusion. The use of these semiconductor layer deposition techniques at such high temperatures causes degradation of the front transparent electrode layer 14 where the electrode layer is comprised of any one of the group ZnO, ZnS and CdO.

Other semiconductor layer deposition techniques, such as electro-deposition, are done at less than 100 degrees C., but involve liquid chemicals such as acids or bases that also can degrade the performance of the transparent electrode layer during the deposition process. This degradation is manifested in a reduced transparency to the light that must reach the active semiconductor junction 28, and is also marked by significant loss of conductivity in the transparent electrode layer 14. It is for these reasons that candidates from this group of compounds are not typically chosen as transparent electrode layers in photovoltaic cells.

In accordance with the present invention, however, the deposition or application of the n-type and p-type layers, 18, 20 is made under process conditions that avoid substantial degradation of the transparent electrode layer 14, which is any one or more of the group ZnO, ZnS and CdO. Preferably, the deposition of the layers 18, 20 of the active semiconductor junction 28 is carried out at a temperature less than about 400 degrees C., and more preferably at a temperature less than about 300 degrees C. However, it is also well-known that ZnO deteriorates when exposed to temperatures above about 400 C even if covered by other layers. In a preferred embodiment of the invention, the deposition of the layers 18, 20 is achieved using a sputtering process. The sputtering process can be, for example, an RF sputtering process, or a pulsed DC sputtering process. Since a sputtering process can be carried out at relatively low temperatures, substantial degradation of such transparent electrode layers as ZnO ZnS and CdO is prevented. Substantial degradation means a substantial loss of the optical transmission quality or the current carrying capacity, or both the optical transmission quality and the current carrying capacity, of the transparent electrode layer.

As an alternative to a sputtering process, an electrodeposition process can be used to deposit the layer 20, provided that layer 18 is deposited by a process that does not cause deterioration of layer 14 and protects layer 14 from chemical attack or thermal degradation during the formation of layer 20. An electro deposition process involves placing the substrate with its conducting layer into a liquid solution containing ions of the type to be deposited and causing a current to flow between the substrate and another electrode in the solution. A chemical bath deposition process, also known as an electro-less deposition, can also be used, as well as other deposition processes. One advantage in using sputtering rather than many alternative deposition processes is that there is no need to rinse or otherwise clean residue from the layers after deposition or to dispose of chemical effluents.

While in most cases the deposition of the n-type layer and the p-type layer will be carried out using the same process, these two layers can be deposited using different processes. For example, the deposition of the n-type layer can be carried out with a sputtering process, and deposition of the p-type layer can be carried out with an electro deposition process, a chemical bath deposition process, or other similar processes. Also, once the n-type layer has been deposited onto the transparent electrode layer, the transparent electrode layer will be somewhat protected, and therefore the p-type layer can be deposited using a somewhat higher temperature process without substantially degrading the desired transparency and conductivity qualities of the transparent electrode layer. For example, the depositing of the n-type layer could be carried out with a sputtering process, and the depositing a p-type layer could be carried out with a high temperature vapor deposition process.

In a preferred embodiment of the invention, the transparent electrode layer 14 is doped with a Group III element. Preferably, the transparent electrode layer is ZnO, and the ZnO is doped with aluminum. Also, preferably the layers of the active semiconductor junction are deposited in a manner limiting degradation of the ZnO transparent electrode layer to the extent that the electrical sheet resistance of the ZnO transparent electrode layer is less than about 5 ohms per square, and the transparency is greater than about 85 percent of visible light. Even more preferably, the electrical sheet resistance of the ZnO transparent electrode layer is less than about 3 ohms per square. When the method of the invention is used to make a thin-film photovoltaic cell, the conversion efficiency is preferably greater than about 8 percent, more preferably greater than about 10 percent, and most preferably greater than about 13 percent.

Apparatus for performing the preferred method of applying these layers according to the invention is illustrated in FIG. 2. A radio frequency (RF) (typically 13.56 megahertz) or a pulsed DC reactive sputtering process is preferably used. A disclosure of such a process is contained in U.S. Pat. No. 5,393,675 to Compaan, which is hereby incorporated by reference in its entirety. As shown in FIG. 2, a magnetron sputter gun is indicated generally at 30. The sputter gun 30 includes a sputter target or cathode 32 that is positioned to receive RF power from an RF generator, not shown, by means of conductor 34. The sputter anode is indicated at 36. The material in the target 32 is pressed and sintered cadmium sulfide, cadmium telluride, zinc telluride, or zinc oxide mixed with alumina ($Al_2O_3$) prepared from powder. Behind the target is the substrate 38, which is heated by a heater 40. The sputter gas, argon, or argon plus nitrogen in the case of ZnTe, is introduced into the chamber 42 through inlet pipe 44. Alternatively, in some cases the compound material may be DC sputtered from a conductive, metallic target of, e.g., Zn or Cd or a mixture of Zn and Al, by introducing some group VI component into the sputter gas as, for example, $O_2$ together with the primary sputter gas, usually Ar.

Operation of the magnetron sputter gun 30 creates a plasma region indicated at 46. Ionized atoms of the sputter gas, argon, are driven into the target 32 causing backward sputtering of the target atoms onto the heated substrate 38 to form the deposited layer. The proper background gas must be present in the chamber 42 to facilitate the formation of a sputtering plasma. The sputtering system uses an atmosphere of gas having heavy ions, such as argon at a low pressure that is typically within the range of from about 1 to about 50 milli-Torrs. A typical thickness of the semiconductor layer 48 deposited by this sputtering process is on the order of between 0.1 and 3.0 microns, depending on such factors as the sputtering time, RF power and gas pressure.

One of the advantages of the sputtering technique over alternative doped semiconductor deposition processes is that the sputtering technique can be used to make large sized layers of semiconductor materials. The alternative molecular beam epitaxy process technique, for example, is limited to a maximum size on the order of about several tens of square centimeters. In contrast, sputtering is capable of making semiconductor layers of much larger sizes, including layers that are larger than about 4 $cm^2$, at least as large as about 10 $cm^2$, and preferably as large as or even larger than a square meter. Nitrogen doped semiconductor layers are also advantageous since there is no need to have the semiconductor materials doped with copper. Further, nitrogen-doped back contact semiconductor layers are more transparent than conventional copper-doped semiconductor layers. For example, it has been found that a nitrogen-doped zinc telluride back contact layer maintains an excellent transparency to solar radiation at wavelengths above 700 nm. As a generalization for different group II–group VI compounds, the semiconductor is transparent at photon energies less than the band gap of the semiconductor. This property of improved transparency for the nitrogen-doped back contact material allows the photovoltaic cell 10 to be placed in tandem with an additional solar cell for absorption of more energy from the sun. The additional solar cell or photovoltaic cell can be any suitable type of additional cell, such as a conventional silicon solar cell.

Preferably, the back contact material 22 is zinc telluride doped with nitrogen (ZnTe:N). Numerous other group II–group VI compounds, when doped with nitrogen, can be used with the invention. Examples include zinc selenide, zinc sulfide, mercury selenide, mercury telluride, mercury sulfide, cadmium sulfide, cadmium telluride, cadmium selenide, magnesium telluride, and magnesium selenide. It is to be understood that these compounds can be used alone or in combination with each other. Such combinations can be in the form of alloys. Therefore, the term "depositing a group II–group VI compound" includes depositing one or more group II–group VI compounds, or an alloy of more than one group II–group VI compound.

The doping of the back contact layer 22 with nitrogen provides charge carriers for effective charge conduction from the primary semiconductors 18 and 20 to the conductive electrode layer 24. In many ways the nitrogen doped back contact 22 behaves as would be expected for a back contact material doped with metals such as copper. However doped group II–group VI compounds provide a performance superior to conventional, metal doped compounds because there is no copper involved, and therefore no migration. Also, the semiconductor layer 22 is more transparent than conventional copper-doped semiconductor layers, thereby enabling the photovoltaic cell 10 to be placed in tandem with an additional solar cell, not shown in FIG. 1, but shown in FIG. 3, for absorption of more energy from the sun. The additional solar cell or photovoltaic cell can be any suitable type of additional cell, such as a conventional silicon solar cell.

As shown in FIGS. 3 and 4, a photovoltaic cell 10 is assembled together with an additional or second photovoltaic cell 50 to form a combined or tandem 2-terminal cell arrangement indicated generally at 52. The second photovoltaic cell 50 is designed to absorb red and infrared solar radiation. In one example, the second photovoltaic cell 50 includes a zinc oxide transparent conductor layer 54, which is preferably doped with aluminum (ZnO:Al). An n-type cadmium sulfide semiconductor layer 56, and a p-type copper indium diselenide ($CuInSe_2$) semiconductor layer 58 form an n-p junction within the second cell 50. A final electrode 60 of a conductive material, such as molybdenum, includes a conductive lead 62 for conducting current through the electric circuit. The last layer is a glass layer 64, which acts as a substrate.

At the boundary between the two tandem cells 10 and 50 a tunnel junction is formed. This junction is alternatively called a recombination junction or a shorting junction. In the embodiment of the invention shown in FIG. 3, this junction is positioned between the nitrogen doped zinc telluride (ZnTe:N) layer 22 of cell 10 and the zinc oxide layer 54 of the cell 50. As is well known, a recombination junction provides for low loss flow of current via efficient electron-hole recombination between the two semiconductors. In the electron-hole recombination process positive holes from the CdTe flow into the p-type ZnTe:N meeting electrons from the n-type ZnO:Al. At the interface between the ZnTe and the ZnO they recombine or annihilate each other. But the current is continuous and equal since the positive holes going down carry the same current as the negative electrons coming up.

The tandem arrangement shown in FIG. 3 is a 2-terminal tandem arrangement, having conductive leads 16 and 62 leading to the electric circuit. As an alternative arrangement, the tandem cell assembly 52 can be configured as a 4-teminal tandem arrangement. In that case, additional conductive leads, not shown, would be connected to the conductive layers 24 and 54, thereby resulting in two separate circuits, also not shown. The advantage of the 4-terminal system with two separate circuits is that the current from the two cells would not be required to match and no electrical or physical contact is needed between cell 10 and cell 50. Where a 4-terminal system is used, there must be a conductive grid in layer 24 and in layer 54, but these connectors must be substantially transparent to light. A preferred conductive grid 66 for this purpose is shown in FIG. 4. If the two cells are in physical contact, the two grids may be combined into one common grid to form a three-terminal cell which is functionally equivalent to the separated four-terminal cell.

EXAMPLE I

A thin-film photovoltaic cell was made using the method of the invention. First, a substrate layer of aluminosilicate glass was coated with a ZnO layer doped with aluminum using an RF sputtering process. Then, RF sputtering was used to add an n-type layer of CdS and a p-type layer of CdTe at a temperature of about 250 degrees C. The two-inch sputter sources were commercially available pressed and sintered targets with purity of 99.99% to 99.999%. A vapor $CdCl_2$ treatment at 385–390 C was used before contacting with the application of the back electrode layer. Finally, a back electrode layer of Cu/Au was applied using a thermal evaporation process. No etching or rinse was used at any point after the initial glass cleaning. The RF (or pulsed DC) sputtering was carried out in a chamber assembled from a six-way stainless steel, copper gasketed cross with a two-inch planar magnetron mounted horizontally in one arm. The magnetron used an unbalanced magnetic field configuration. The base vacuum pressure was about 0.5 micro-Torr before introducing the sputter gas to a pressure typically within the range of about 5 to about 30 milli-Torr. The substrate layer having the transparent electrode layer was suspended at the center of the cross about 2.5 inches from the sputter target in a heater assembly to radially heat the substrate layer. The gas flow of typically 30 standard cubic centimeters per minute (SCCM), controlled by two parallel mass flow controllers, entered from another arm of the cross approximately in the plane of the substrate, although the gas injection can be made also at the magnetron between the ground shroud (anode) and the target (cathode).

EXAMPLE II

The solar cell produced in Example I was tested for conversion efficiency, defined as the amount of electric energy produced as a percentage of the incident solar energy. When tested for conversion efficiency, the result was a conversion efficiency of about 14 percent, as measured using an air mass 1.5 solar simulator with intensity and spectrum equivalent to one sun at air mass 1.5 (sunlight after passing through 1.5 times the thickness of the earth's atmosphere). The improved performance over conventional solar cells was primarily due to higher current through the front transparent electrode layer 14. The ZnO-based photovoltaic cell had a short-circuit current per unit area of $J_{SC}$=23.6 mA/cm$^2$ vs. 20.7 mA/cm$^2$ for a similar sputtered 12.6% cell on a commercial tin-oxide coated (Pilkington, Tec-7) soda-lime glass substrate. Other parameters were fill factor, FF=73.25% and open-circuit voltage, $V_{OC}$=814 mV, for an NREL (National Renewable Energy Laboratory) verified efficiency of 14.0%.

EXAMPLE III

The front transparent electrode layer of the photovoltaic cell produced in Example I was tested for electrical sheet resistance using a four-point probe tester, and measured at 2 ohms per square with about 90 percent transparency. In contrast, conventional transparent electrode layers of doped tin oxide typically have electrical sheet resistance greater than about 7 ohms per square, and they transmit no more than about 80 percent of the visible light.

EXAMPLE IV

A tandem, thin-film photovoltaic cell was made using the method of the invention. The cell had two active semiconductor junctions and a tunnel junction as shown in the design of FIG. 3. First, a substrate layer of sodalime glass was coated with a ZnO layer doped with aluminum using an RF sputtering process. Then, RF sputtering was used to add an n-type layer of CdS and a p-type layer of CdTe at a temperature of about 250 degrees C. The two-inch sputter sources were commercially available pressed and sintered targets with purity of 99.99% to 99.999%. A vapor $CdCl_2$ treatment at 385–390 C was used before contacting with the application of the back electrode layer. Finally, a transparent back electrode layer consisting of p-type ZnTe reactively RF sputtered with molecular nitrogen mixed in the argon sputtering gas. This back electrode layer of the top cell served as the first layer of the tunnel junction. The tunnel junction was completed with the second ZnO:Al layer coated by RF sputtering. This layer served as the top electrode layer of the bottom cell. Then, RF sputtering was used to add an n-type layer of CdS at a temperature of about 250 degrees C. and a p-type layer of HgCdTe at a temperature of about 100 degrees C. The HgCdTe was RF magnetron sputtered from a cold-pressed target formed from a mixture of about 20 percent HgTe and 80 percent CdTe. A second vapor CdCl2 treatment at 385–390 C was used before the application of the back electrode layer. The back electrode layer of the bottom cell consisted of Cu/Au applied using a thermal evaporation process. This two-terminal, tandem solar cell device structure was tested for current-voltage (I-V) characteristics under air mass 1.5 illumination and also for spectral quantum efficiency. The device produced an open-circuit voltage of 960 milli-volts, indicating the addition of voltage across the two junctions. The short circuit current was 2.0 milli-amperes per square centimeter and the device had an overall efficiency of 1.2 percent. The spectral quantum efficiency showed good response from about 400 nm to about 1100 nm. Although the current density and efficiency are low in this prototype device, these results indicate this type of tandem device structure with magnetron sputtered layers has the potential to reach efficiencies of 20–25 percent.

In another embodiment of the invention, the substrate layer is a flexible layer. When the method of the invention is used to form a diode structure of the invention, such as a photovoltaic cell or an LED, using a flexible substrate layer, the resulting diode structure attains the unique quality of being able to conform to non-planar surfaces. Also, diode structures based on flexible membranes can be folded or rolled up to a compact state for storage or transportation. An example of a flexible membrane diode structure is a flexible photovoltaic cell that can be rolled up for transport on a space shuttle and then unrolled for use as a solar panel in space. Also, a flexible photovoltaic cell made according to the invention can be used as part of a balloon or a fabric structure, such as a tent.

The flexible membrane used as the substrate layer in the method of this invention can be any membrane that is flexible, highly transparent to solar light, suitable for the addition of subsequently applied semiconductor layers, and capable of withstanding the 250 degrees C. temperatures of the sputtering process, other semiconductor layer deposition process involved, and the cadmium chloride post-deposition treatment at about 390 degrees C. Also, the membrane should have a high tensile strength for durability. A preferred membrane for use as the substrate layer is a high temperature polymer, such as a polyimide. A specific membrane that can be used is a Kapton® polyimide film made by DuPont. Thin metal films, such as a molybdenum film, can also be used as a flexible substrate layer according to the method of the invention. However, metal films have poor infrared emissivity properties so that in space the cells may overheat, and therefore photovoltaic cells based on polymer membranes are advantageous.

Although transparent electrode layers comprised of thin films of ZnO doped with aluminum are known to possess the requisite transparency to visible light while maintaining low electrical resistance, it is also well-known that ZnO deteriorates when exposed to temperatures above about 400 degrees C., even if covered by other layers. By depositing subsequent layers, such as CdS, CdTe, and the back transparent electrode layer at relatively low temperatures, using magnetron sputtering or another low temperature process, there is no substantial degradation of the high transparency or the low electrical resistivity of the front transparent electrode layer. Low resistance is critically important for thin-film solar cells because the electrons in the transparent electrode layer must flow to the negative contact 16 with the minimum possible resistive loss. High transparency in the transparent conductor is needed to maximize the number of photons absorbed in the layers below (CdS and CdTe) which create the electrons and holes.

Figure 5:
FIG. 5 is a schematic plan view of a monolithically integrated solar panel having individual solar cells made according to the method of the invention.
Figure 6:
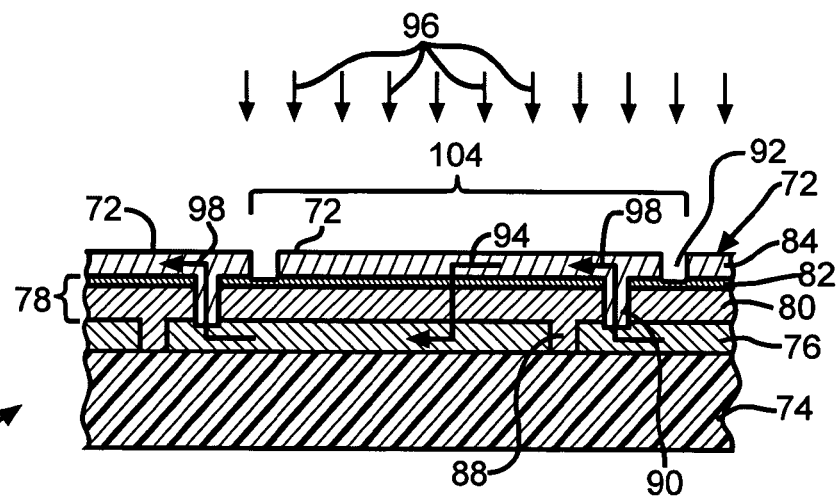
FIG. 6 is a schematic cross-sectional view in elevation of several of the solar cells, taken along line 6—6 of FIG. 5.

As shown in FIGS. 5 and 6, a modular solar panel 70 can be made of a multiplicity of individual solar cells 72, with each of the solar cells made according to the method of the invention. The substrate layer, a polymer substrate 74 is coated with a back electrode layer 76, which can be, for example, a thin layer of molybdenum. It is to be understood that the substrate can be of other materials, such as glass. Next, the active semiconductor junction 78, preferably consisting of a CdTe layer 80 and a CdS layer 82, are applied according to the method of the invention. Finally, the upper transparent electrode layer 84 is applied.

It can be seen in FIG. 6 that the back electrode layer 76 of molybdenum is cut or divided into sections 86 by cuts or scribes 88. Likewise, the active semiconductor junction 78 is cut into sections by scribes 90. Further, the upper transparent electrode layer 84 is cut into sections by scribes 92. The cuts or scribes 88, 90 and 92 are necessitated by the current carrying limitations of the upper transparent electrode layer 84. Preferably, the cutting or scribing is performed sequentially during the manufacturing process as each layer 76, 80, 82 and 84 is applied. Methods of scribing are well known in the art. The flow path of the current includes the current, indicated by current path arrow 94, generated by the active junction 78 in response to the sun's rays 96. At the break or dividing line between adjacent cells 72, as defined by the scribes 88, 90 and 92, the current flows back from the back electrode layer 76 to the next portion of the transparent electrode layer 84 i.e., in the next cell, along current path 98. In this manner, each of the cells 72 is connected to a subsequent cell within the solar panel 70. While the size of the various elements can vary, it would be expected that a solar panel might have a typical size of a 2 ft. by 4 ft., and contain about 100 cells. Each cell would have a width, indicated in FIG. 6 at 104, of about one cm and a length of about 2 ft. Since the ZnO transparent electrode layer applied by the method of the invention is more conductive than conventional front conductive electrodes of prior art materials such as doped $SnO_2$, this allows the width 104 of each cell 72 to be increased over that permitted by prior art materials. The width of the triple-scribe pattern represents merely an electrical interconnect from one cell to the next, and there is no conversion of solar energy within this interconnection area. The result of being able to use cells of increased width 104 is the ability to use a fewer number of scribes, thereby reducing the manufacturing cost, and also thereby increasing the overall power of the solar panel 70 by increasing the active area for solar conversion.

Figure 7:
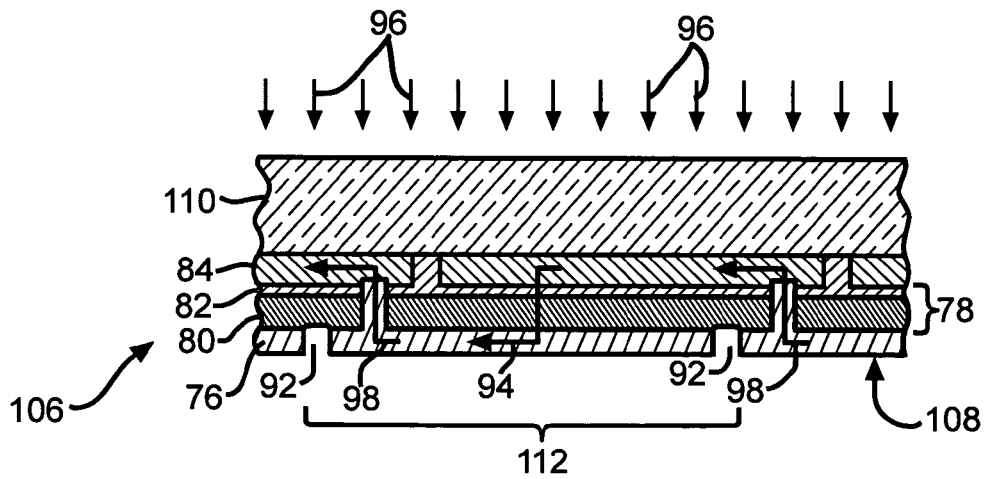
FIG. 7 is a schematic cross-sectional view, similar to FIG. 6, of a solar panel made of solar cells formed on a superstrate rather than a substrate.

As shown in FIG. 7, a solar panel 106 can be made of alternative solar cells 108 formed on a superstrate 110 rather than a substrate 74 as shown in cells 72 of FIG. 6. The width of each cell 108 is indicated at 112. The superstrate can be polymer, glass (as shown) or any other suitable material. In most other respects, the cells 108 are the same as the cells 72. The solar energy 96 is transmitted through the superstrate 110 and the upper transparent electrode layer 84, and reaches the active junction 78. The voltage generated across the junction 78 produces a current, represented by arrow 94. At the scribe-defined edges of each cell 108, the current flows from the back electrode 76 of each cell 108 to the front transparent electrode layer 84 of the next cell along current path 98.

The principle and mode of operation of this invention have been described in its preferred embodiments. However, it should be noted that this invention may be practiced otherwise than as specifically illustrated and described without departing from its scope.

What is claimed is:

1. The method of making a diode structure comprising:
    depositing a transparent electrode layer of any one or more of the group ZnO, ZnS and CdO onto a substrate layer;
    depositing an active polycrystalline semiconductor junction having an n-type layer and a p-type layer onto the transparent electrode layer under process conditions that avoid substantial degradation of the electrode layer, in which the depositing of the n-type layer is carried out with a sputtering process; and
    applying a back electrode coating layer to form a diode structure.

2. The method of claim 1 in which the depositing of the active semiconductor junction is carried out at a temperature less than about 400 degrees C.

3. The method of claim 1 in which the depositing of the p-type layer of the active semiconductor junction is carried out with a sputtering process.

4. The method of claim 1 in which the depositing of the active semiconductor junction includes depositing the p-type layer carried out with one or more of an electro deposition process, a chemical bath deposition process, and a high temperature vapor deposition process.

5. The method of claim 1 in which the electrode layer is ZnO.

6. The method of claim 5 in which the ZnO is doped with a Group III element.

7. The method of claim 6 in which the ZnO is doped with aluminum.

8. The method of claim 5 in which the layers of the active semiconductor junction are deposited in a manner limiting degradation of the ZnO transparent electrode layer to the extent that the electrical sheet resistance of the ZnO transparent electrode layer is less than about 5 ohms per square, and the transparency is greater than about 85 percent of visible light.

9. The method of claim 8 in which the layers of the active semiconductor junction are deposited in a manner limiting degradation of the ZnO transparent electrode layer to the extent that the electrical sheet resistance of the ZnO transparent electrode layer is less than about 3 ohms per square, and the transparency is greater than about 85 percent of visible light.

10. The method of claim 1 in which the diode structure is a thin-film photovoltaic cell.

11. The method of claim 1 in which the diode structure is a thin-film photovoltaic cell having a conversion efficiency greater than about 8 percent.

12. The method of claim 1 in which the diode structure is a thin-film photovoltaic cell having a conversion efficiency greater than about 10 percent.

13. The method of claim 1 in which the substrate layer is a superstrate.

14. The method of making a diode structure comprising:
depositing a transparent electrode layer of any one or more of the group ZnO, ZnS and CdO onto a flexible layer;
depositing an active polycrystalline semiconductor junction having an n-type layer and a p-type layer onto the substrate layer under process conditions that avoid substantial degradation of the electrode layer, in which the depositing of the n-type layer is carried out with a sputtering process; and
applying a back coating electrode layer to form a diode structure.

15. The method of claim 14 in which the flexible layer is a polymer layer.

16. The method of claim 14 in which the flexible layer is a metal film.

17. The method of claim 14 in which the depositing of the active semiconductor junction is a sputtering process carried out at a temperature less than about 400 degrees C.

18. The method of claim 14 in which the transparent electrode layer is ZnO doped with a Group III element.

19. The method of claim 14 in which the layers of the active semiconductor junction are deposited in a manner limiting degradation of the ZnO transparent electrode layer to the extent that the electrical sheet resistance of the ZnO transparent electrode layer is less than about 5 ohms per square, and the transparency is greater than about 85 percent of visible light.

20. The method of claim 14 in which the diode structure is a thin-film photovoltaic cell having a conversion efficiency greater than about 8 percent.

21. The method of claim 14 in which the diode structure is a thin-film photovoltaic cell having a conversion efficiency greater than about 10 percent.

22. The method of making a diode structure comprising:
depositing a transparent electrode layer of any one or more of the group ZnO, ZnS and CdO onto a substrate layer;
scribing the transparent electrode layer into sections;
depositing an active polycrystalline semiconductor junction having an n-type layer and a p-type layer onto the transparent electrode layer under process conditions that avoid substantial degradation of the electrode layer, in which the depositing of the n-type layer is carried out with a sputtering process;
scribing the active semiconductor junction into sections;
applying a back electrode coating layer to form a diode structure; and
scribing the back electrode coating layer into sections;
wherein a series of cells is formed, with each of the cells comprising one of the electrode layer sections, one of the active semiconductor junction sections, and one of the back electrode coating layer sections, and wherein the series of cells is electrically connected in series to form a monolithically integrated solar panel.

23. The method of claim 22 in which the depositing of the active semiconductor junction is carried out at a temperature less than about 400 degrees C.

24. The method of claim 22 in which the depositing of the p-type layer of the active semiconductor junction is carried out with a sputtering process.

25. The method of claim 22 in which the electrode layer is ZnO doped with a Group III element.

26. The method of claim 22 in which the layers of the active semiconductor junction are deposited in a manner limiting degradation of the ZnO transparent electrode layer to the extent that the electrical sheet resistance of the ZnO transparent electrode layer is less than about 5 ohms per square, and the transparency is greater than about 85 percent of visible light.

27. The method of claim 22 in which the diode structure is a thin-film photovoltaic cell having a conversion efficiency greater than about 8 percent.

28. The method of making a diode structure having a substrate configuration comprising:
applying a back electrode coating layer to a polymer substrate;
depositing an active polycrystalline semiconductor junction having a p-type layer and an n-type layer onto the back electrode coating layer under process conditions that avoid substantial degradation of the polymer substrate, in which the depositing of the n-type layer is carried out with a sputtering process; and
depositing a transparent electrode layer of any one or more of the group ZnO, ZnS and CdO onto the semiconductor junction to form a diode structure.

29. The method of claim 28 in which the depositing of the active semiconductor junction is carried out at a temperature less than about 400 degrees C.

30. The method of claim 28 in which the depositing of the p-type layer of the active semiconductor junction is carried out with a sputtering process.

31. The method of claim 28 in which the electrode layer is ZnO doped with a Group III element.

32. The method of claim 28 in which the layers of the active semiconductor junction are deposited in a manner limiting degradation of the ZnO transparent electrode layer to the extent that the electrical sheet resistance of the ZnO transparent electrode layer is less than about 5 ohms per square, and the transparency is greater than about 85 percent of visible light.

33. The method of claim 27 in which the diode structure is a thin-film photovoltaic cell having a conversion efficiency greater than about 8 percent.

34. The method of making a tandem diode structure comprising:
depositing the first transparent front electrode layer of any one or more of the group ZnO, ZnS and CdO onto a substrate layer;
depositing the first active semiconductor junction having an n-type layer and a p-type layer onto the first transparent electrode layer under process conditions that avoid substantial degradation of the electrode layer;
depositing a first back transparent electrode coating layer under process conditions that avoid substantial degradation of the top electrode layer, to form a first diode structure and to form a first layer of a tunnel junction;
applying a second transparent front electrode coating layer of any one or more of the group ZnO, ZnS and CdO onto the back transparent coating layer of the top cell under process conditions that avoid substantial degradation of the top electrode layer, with the second transparent electrode coating layer completing the tunnel junction;
depositing a second active semiconductor junction having an n-type layer and a p-type layer onto the second transparent electrode layer under process conditions that avoid substantial degradation of both the first and second transparent electrode coating layers; and
applying a second back electrode coating layer to form a second diode structure and to complete the tandem diode structure.

35. The method of claim 34 in which the depositing of one or both of the active semiconductor junctions is carried out at a temperature less than about 400 degrees C.

36. The method of claim 34 in which the depositing of one or both of the active semiconductor junctions is carried out with a sputtering process.

37. The method of claim 34 in which one or both of the front electrode layers is ZnO doped with a Group III element.

38. The method of claim 34 in which the first back transparent electrode coating layer is ZnTe:N.

* * * * *